United States Patent [19]

James

[11] 4,075,651
[45] Feb. 21, 1978

[54] HIGH SPEED FET EMPLOYING TERNARY AND QUARTERNARY III-V ACTIVE LAYERS

[75] Inventor: Lawrence W. James, Palo Alto, Calif.

[73] Assignee: Varian Associates, Inc., Palo Alto, Calif.

[21] Appl. No.: 671,189

[22] Filed: Mar. 29, 1976

[51] Int. Cl.² .................. H01L 29/203; H01L 29/80; H01L 47/00
[52] U.S. Cl. .......................................... 357/22; 357/3; 357/15; 357/16; 357/61; 357/64
[58] Field of Search .................... 357/3, 22, 61, 16, 15

[56] References Cited

U.S. PATENT DOCUMENTS

| | | | |
|---|---|---|---|
| 3,289,052 | 11/1966 | Mead | 357/61 |
| 3,696,262 | 10/1972 | Antypas | 357/16 |
| 3,745,427 | 7/1973 | Hilsnm et al. | 357/1 |
| 3,914,784 | 10/1975 | Hunsperger et al. | 357/61 |
| 3,977,015 | 8/1976 | Irving et al. | 357/3 |
| 3,982,261 | 9/1976 | Antypas | 357/18 |

OTHER PUBLICATIONS

Maloney et al., IEEE Int. Electron Dev. Meeting, Dec. 1974, Technical Digest pp. 296-298.

*Primary Examiner*—William D. Larkins
*Attorney, Agent, or Firm*—Stanley Z. Cole; Robert K. Stoddard

[57] ABSTRACT

A field effect transistor (FET) preferably employs an epitaxial layer of indium gallium arsenide as its active layer. On the surface of the active layer, ohmic source and drain contacts are spaced from respectively opposite sides of a Schottky barrier (rectifying) gate electrode. The active layer is grown over an epitaxial transition layer which is graded from gallium arsenide to indium gallium arsenide and is doped with chromium or oxygen to be semi-insulating. The transition layer is in turn formed over a bulk, intrinsic layer of gallium arsenide. High speed operation of the FET is obtainable because the active layer has excellent electron transport characteristics. Other materials suitable for the active layer are indium arsenide phosphide and indium gallium arsenide phosphide.

11 Claims, 3 Drawing Figures

POSITIONS OF Γ, X & L MINIMA FOR $In_{1-x}Ga_xAs$; $X_{0\rightarrow 1}$

HIGH SPEED FET EMPLOYING TERNARY AND QUATERNARY III-V ACTIVE LAYERS

FIELD OF THE INVENTION AND DESCRIPTION OF PRIOR ART

The invention herein described was made in the course of or under a contract or subcontract thereunder (or grant) with the Department of the Navy, Office of Naval Research.

High frequency field effect transistors employ ohmic-contact source and drain electrodes on opposite sides of a Schottky-barrier gate electrode on the surface of a body of semiconductive material. In such transistors it is desirable to raise the maximum frequency of operation as much as possible in order that they can be used at higher microwave frequencies, thereby to displace the use of microwave vacuum tubes, with their disadvantages of size, weight, fragility, and requirement for heater energy.

Heretofore most field effect transistors were made of the conventional semiconductive materials, germanium and silicon. Recently, gallium arsenide field effect transistors have been commercially made available. Such transistors have low noise and are very stable in operation while their silicon and germanium counterparts have certain limitations affecting their high frequency response. The present invention relates to field effect transistors employing new semiconductive materials which overcome some of the limitations of prior art devices and thereby enable higher frequency response to be provided.

Accordingly, several objects of the invention are to provide a higher speed field effect transistor, to provide a field effect transistor employing new semiconductive materials, and to provide a field effect transistor employing new and advantageous properties of semiconductive materials. Further objects and advantages of the invention will become apparent from a consideration of the ensuing description thereof.

DRAWINGS

DESCRIPTION OF PREFERRED EMBODIMENT

Figure 1:
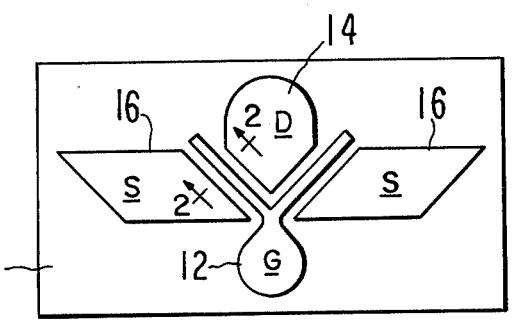
FIG. 1 is a topographic view of a field effect transistor.

In a high frequency field effect transistor (FET) a thin layer of doped semiconductive material is employed as the active region of the device. A Schottky-barrier gate electrode is formed over this layer and source and drain contacts are also formed over the layer spaced from and on opposite sides of the gate electrode. In operation, electrons travel from source to drain past and underneath the gate electrode. This electron current can be controlled by varying the bias on, and hence the size of the depletion region under, the gate electrode so as to variably constrict the flow of electrons from source to drain.

Obviously the speed of operation of an FET is dependent upon the time required for electrons to travel from source to drain in the active layer of semiconductive material of the device. The faster the electrons can travel through the active layer, the higher the usable frequency of the transistor. This transit time can obviously be improved by placing the source and drain electrodes as close together as possible, but a constraint on the closeness of such spacing is presented by the fact that the gate electrode must be placed therebetween and both the source electrode and drain contacts must be spaced from the gate electrode.

I have discovered that the electron transit time can be decreased by utilizing materials for the active layer which have superior electron transport characteristics, in the presence of the applied source-drain electric field, than active layer materials heretofore used. Although the mechanism of electron transport from source to drain in an active layer of semiconductive material is complex and involves advanced theories of solid state physics, I believe that the following theories are applicable.

In a field effect transistor the electric field from source to drain under normal bias conditions is above the threshold for intervalley transfer of electrons, that is, the transfer of electrons from the lowest electron energy level band to higher energy level electron energy band which has a lower mobility. Also, the electron transit time in an FET is not large with respect to the intervalley scattering time, that is the time required for electrons to scatter, in the presence of an electric field, from one energy band to another energy band. Therefore it is necessary to consider the actual dynamics of electron movement rather than just their static velocity-field characteristics when estimating FET performance.

An optimum FET material would be one in which electrons travel (in response to the applied field due to the source-drain bias) at the highest possible velocity while in the gamma electron band, where their effective mass is lower and hence their velocity is higher, and in which electrons spend the longest possible time at high energy levels in the gamma minimum before transferring into minima of upper levels.

Indium phosphide, while apparently a superior material to gallium arsenide for this purpose because of its high peak velocity, is actually not a superior material because it has a high intervalley transfer rate, whereby electrons do not remain long at high energy levels in the gamma minimum before transferring into upper valleys. I have reported this relatively high intervalley transfer rate at 44 J. Appl. Phys. 2746 (1973). Specifically, the deformation potential constant for transfer from the gamma to the X level in indium phosphide is about 1 to $1.5 \times 10$ to the ninth electron volts per centimeter (eV/cm), which is substantially higher than that for gallium arsenide ($5 \times 10$ to the eighth eV/cm), and since scattering time is proportional to the inverse square of the deformation potential, more rapid scattering of electrons into the L level valleys will occur in indium phosphide, thereby overcoming the fact that a higher energy is required to make the transfer.

I have discovered that superior electron transport characteristics can be obtained by using certain ternary or quaternary materials, namely indium gallium arsenide, indium arsenide phosphide, and indium gallium arsenide phosphide. In the preferred embodiment, I use indium gallium arsenide for the active layer of an FET since indium arsenide phosphide and indium gallium arsenide phosphide must be grown on InP-based materials which are semi-insulating, yet it is relatively difficult to grow semi-insulating layers of these materials. Also n-doped InP materials have a relatively low Schottky-barrier height.

FIG. 1 is a topological view of an FET 10. FET 10 has a gate electrode 12 which is formed of a material which provides a Schottky-barrier (rectifying) junction with the underlying semiconductive material, a drain electrode 14 which provides an ohmic contact with the underlying semiconductive material, and two ohmic source electrodes 16. The gate electrode has a relatively wide contact area with two fingers extending therefrom, the drain electrode is positioned between the two fingers, and the source electrodes are positioned on the opposite sides of the two fingers from the drain electrode. The purpose of the plural fingers is to lower gate electrode resistance.

Figure 2:
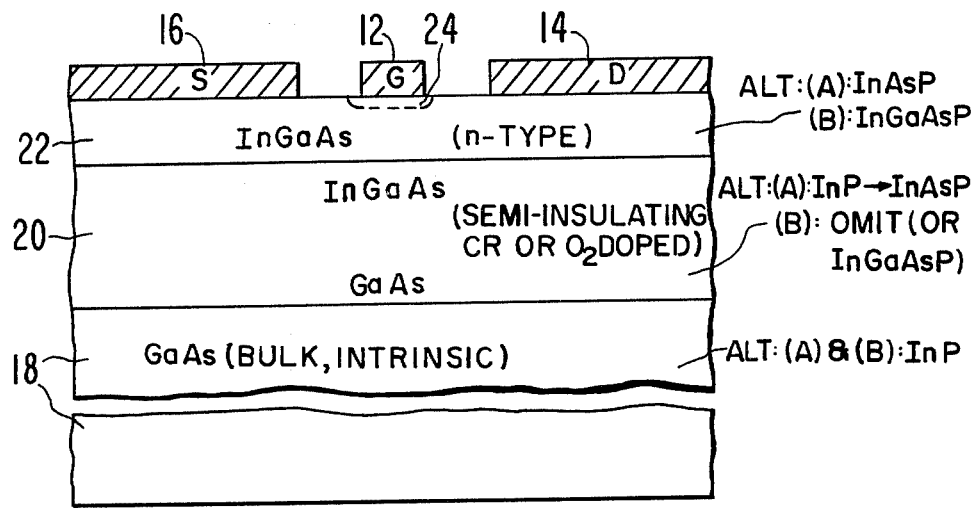
FIG. 2 is a cross-sectional view of the transistor of FIG. 1 taken across the line to 2—2.

In the cross-sectional view of FIG. 2, where vertical dimensions are exaggerated, it is seen that a bulk-grown gallium arsenide intrinsic layer 18 is employed as a substrate. Layer 18 has a resistivity of about 10 to the eighth ohm-centimeters and is about 14 mils thick. On layer 18 a semi-insulating epitaxial layer 20 is grown, preferably by vapor phase epitaxy. Layer 20 is about 1 to 3 microns thick and is graded from gallium arsenide as a starting material at the bottom to indium gallium arsenide at the top, i.e., during epitaxial growth, indium is gradually added so that the final composition of the layer is indium gallium arsenide. The proportions of the final III-A materials are preferably 18% indium and 82% gallium.

During epitaxial growth, layer 20 is preferably doped with oxygen or chromium to render it semi-insulating in well known fashion. For example, hydrogen can be bubbled through chromiumoxy-chloride liquid so as to obtain 5 × 10 to the minus sixth mols per minute of chromium during the entire epitaxial growth phase.

Lastly the final, active layer 22 of indium gallium arsenide with 18% indium, 82% gallium in the III-A constitutent, is grown about 0.4 micron thick. Layer 22 is doped with sulphur to be of n-type conductivity and so that it has a carrier concentration of about 10 to the 17th dopant atoms per cubic centimeter.

Thereafter gate, drain, and source electrodes and contacts 12, 14, and 16 are formed on the surface in well known fashion. For example, the source and drain contacts can be formed of about 400 Angstroms of 88% gold — 12% germanium, followed by 75 Angstroms of nickel, followed by 4500 Angstroms of gold. The Schottky-barrier gate electrode 12 can be formed of 1,000 Angstroms of platinum, followed by 3500 Angstroms of gold. The entire die 10 can be about 16 mils square, the gate electrode fingers can each be about 1 by 100 microns rectangular, and the source and drain contacts 14 and 16 can be about 4 to 5 mils on each side with the shapes indicated.

In operation, electrons travel from the source to the drain through layer 22 in well known fashion and are controlled by the size of a depletion layer 24 created under gate electrode 12 by the bias (not shown) applied to gate electrode 12. Layer 20 does not play an active part in operation, but forms a substrate for the epitaxial growth of layer 22. Similarly, layer 18 forms a bulk substrate for epitaxial growth of layer 20. Layer 20 is gradually graded from gallium arsenide to indium gallium arsenide in the proportions shown in order to provide a lattice constant-matched surface for the growth of epitaxial layer 22.

Transition layer 20 has the highest possible resistivity so as not to add shunt current to that traveling in layer 22; due to the thinness of layer 20, a similar criterion applies to bulk layer 18.

As indicated by "Alt. A" in FIG. 2, in lieu of indium gallium arsenide for layer 22, an indium arsenide phosphide layer can be employed, in which case layer 20 would be graded from indium phosphide to indium arsenide phosphide and bulk layer 18 would be formed of indium phosphide. In this case, the indium arsenide phosphide active layer would provide superior performance over an indium phosphide active layer in the same manner as the indium gallium arsenide layer improves over a gallium arsenide layer.

As indicated by "Alt B" in FIG. 2, indium gallium arsenide phosphide can also be employed as the active layer, in which case transition layer 20 can be omitted and layer 18 can be formed of semi-insulating indium phosphide since, as noted in the copending application of G. A. Antypas, Ser. No. 496,487, originally filed 22 Sept. 1972, now U.S. Pat. No. 3,982,261, indium gallium arsenide phosphide can be grown with a perfect lattice match on indium phosphide. However, if any form of indium gallium arsenide phosphide which is not lattice matched to indium phosphide is used, a transitional layer (InP to InGaAsP) would be required. Compositions of InGaAsP between InGaAs and InAsP will also provide good performance in this bandgap range, i.e., compositions of the general form $In_{1-x}Ga_xAs_{1-y}P_y$, where x + y is less than 1.

Figure 3:
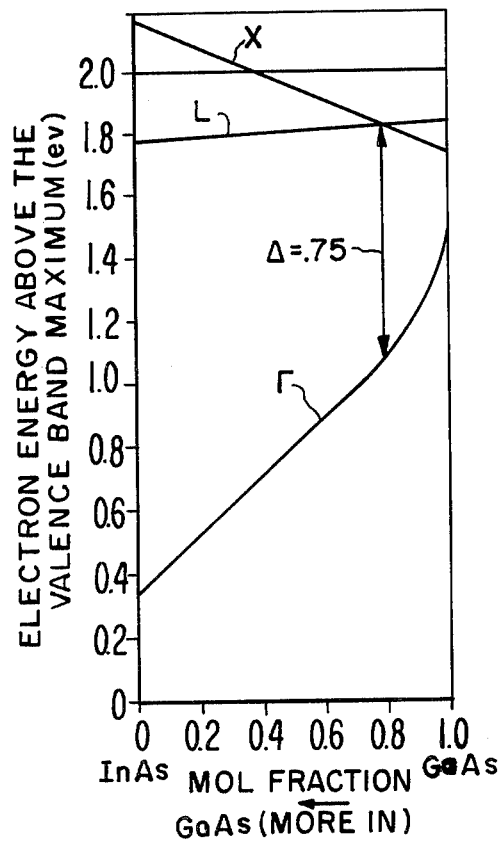
FIG. 3 is a plot of the positions of the gamma, X, and L minima for indium gallium arsenide with varying percentages of indium from zero to 100.

FIG. 3 plots the position of the gamma, X, and L minima for various proportions of indium in an indium gallium arsenide layer. (Although FIG. 3 was considered an accurate representation of the energy levels of compounds useful in this invention as of the time of filing this patent application, subsequent work in the field has shown that the L, and particularly the X minima have slopes which differ from the ones shown in FIG. 3. See the following articles: Physical Review Letters, Vol. 37 No. 2, Sept. 20, 1976, page 766; Applied Physics Letters, Vol. 30, No. 4, Feb. 15, 1977, page 205.) It can be seen that with a greater percentage of indium (left hand side of scale) the gamma effective mass decreases, the energy of the gamma minima decreases and the energy of the X minima increases. Decreased effective mass aids performance by reducing the series resistance of the source. Both decreasing effective mass and increasing the gamma to X separation will contribute to shortening the electron transit time through the active layer, assuming that the gamma to X deformation potential coupling coefficient is relatively independent of composition. It has been found empirically that optimum results are obtained with 15 to 18% indium, although satisfactory results can also be obtained with from about 0 to 50% indium.

While the above description contains many specificities, these should not be construed as limitations on the scope of the invention, but rather exemplifications of several preferred embodiments thereof. For example, FET's with non-coplanar electrodes (e.g., gate on underside of active layer) can be used. The true scope of the invention should be determined by the language of the appended claims and their legal equivalents.

What is claimed is:

1. A high-speed field effect transistor comprising an active epitaxial layer of a predetermined conductivity type, a rectifying gate contact and ohmic source and drain contacts on said active layer, said gate contact being positioned to control current flow between said source and drain contacts, said active layer comprising a compound of at least three elements selected from columns III and V of the Periodic Table and doped to be of a predetermined conductivity type, said compound being $In_{1-x}Ga_xAs_{1-y}P_y$, where $x + y$ is greater than 0.5 and less than 1.

2. The transistor of claim 1 wherein said compound is indium gallium arsenide, wherein the mol fraction of gallium arsenide is greater than 0.5.

3. The transistor of claim 2 wherein said active layer is formed over an epitaxial layer which is graded from gallium arsenide to indium gallium arsenide, said epitaxial layer being in turn formed upon a bulk material substrate of gallium arsenide.

4. The transistor of claim 1 wherein said compound is indium arsenide phosphide.

5. The transistor of claim 4 wherein said active layer is formed over an epitaxial layer which is graded from indium phosphide to indium arsenide phosphide, said epitaxial layer being in turn formed upon a bulk material substrate of indium phosphide.

6. The transistor of claim 1 wherein said active layer is formed over a bulk material substrate.

7. The transistor of claim 1 wherein said active layer is formed over an epitaxial layer which is graded from indium phosphide to indium gallium arsenide phosphide, said epitaxial layer being in turn formed upon a bulk material substrate of indium phosphide.

8. The transistor of claim 1 wherein said source, gate, and drain contacts are formed upon a common surface of said active layer.

9. The transistor of claim 1 further including a supporting layer of semiconductive material under said active layer, said supporting layer having a very high resistivity so as not to form a significant shunt across said active layer.

10. The transistor of claim 9 wherein said supporting layer is an epitaxial layer and further including a substrate under said supporting layer, said substrate being formed of bulk material.

11. The transistor of claim 10 wherein said substrate is gallium arsenide, said supporting layer is gradually graded from gallium arsenide at the bottom portion thereof to indium gallium arsenide at the top portion thereof and is doped with a material selected from the class consisting of chromium and oxygen, and wherein said active layer is indium gallium arsenide and is doped with an n-type dcpant.

* * * * *